US010226675B2

(12) United States Patent
Wilder

(10) Patent No.: US 10,226,675 B2
(45) Date of Patent: Mar. 12, 2019

(54) WATER RESISTANT AUDIO UPGRADE KIT FOR BAG TOSS GAME

(71) Applicant: VIBES AUDIO LLC, Irvine, CA (US)

(72) Inventor: Shane Wilder, Aliso Viejo, CA (US)

(73) Assignee: VIBES AUDIO LLC, Irvine, CA (US)

( * ) Notice: Subject to any disclaimer, the term of this patent is extended or adjusted under 35 U.S.C. 154(b) by 4 days.

(21) Appl. No.: 15/228,560

(22) Filed: Aug. 4, 2016

(65) Prior Publication Data

US 2018/0036630 A1 Feb. 8, 2018

(51) Int. Cl.

| | |
|---|---|
| ***H03F 3/68*** | (2006.01) |
| ***A63B 67/06*** | (2006.01) |
| ***H04R 1/02*** | (2006.01) |
| ***H04R 7/04*** | (2006.01) |
| ***H04R 9/06*** | (2006.01) |
| *A63B 71/06* | (2006.01) |

(52) U.S. Cl.

CPC ............. *A63B 67/06* (2013.01); *H04R 1/028* (2013.01); *H04R 7/045* (2013.01); *H04R 9/066* (2013.01); *A63B 71/0622* (2013.01); *A63B 2071/0625* (2013.01); *A63B 2207/02* (2013.01); *A63B 2225/50* (2013.01); *H04R 2201/028* (2013.01); *H04R 2420/07* (2013.01)

(58) Field of Classification Search

USPC ........ 381/28, 55, 57, 77, 120, 150, 161, 311

See application file for complete search history.

(56) References Cited

U.S. PATENT DOCUMENTS

| | | | | |
|---|---|---|---|---|
| 6,929,549 B1 * | 8/2005 | Yamada | A63F 13/12 | 463/42 |
| 2005/0254778 A1 * | 11/2005 | Pettersen | H04R 1/44 | 386/333 |
| 2014/0015198 A1 * | 1/2014 | Francis | A63B 63/00 | 273/398 |

* cited by examiner

*Primary Examiner* — Yosef K Laekemariam

(74) *Attorney, Agent, or Firm* — Knobbe, Martens, Olson & Bear, LLP

(57) ABSTRACT

A game surface, such as a top surface of a cornhole game, can be configured to produce a sound by using a sound system mounted on an underside of the cornhole platform. The sound system can use one or more exciters to produce sound through the top surface of each of the two cornhole platforms used for game play. In some embodiments, a communication protocol may link the two sound systems, in each of the two cornhole platforms, so that each platform generates the same sound from a single source. The sound system may be easily retro-fitted to existing cornhole game platforms or may be formed during manufacture thereof.

20 Claims, 4 Drawing Sheets

WATER RESISTANT AUDIO UPGRADE KIT FOR BAG TOSS GAME

BACKGROUND OF THE INVENTION

1. Field of the Invention

One or more embodiments of the invention relates generally to audio systems. More particularly, the invention relates to a water resistant audio upgrade kit for a bag toss game, such as cornhole.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Cornhole or corn toss is similar to horseshoes except contestants use wooden boxes called cornhole platforms and corn bags instead of horseshoes and metal stakes. Contestants take turns pitching their corn bags at the cornhole platform until a contestant reaches the score of 21 points.

The popularity of the game has significantly increased in the past 20 years, moving from a campground game to a game with sanctioned tournaments appearing on national televised sports networks. Many restaurants and parks have areas dedicated to the game and, due to the relatively low cost of the cornhole platforms and bags, many individuals own game sets for personal use.

Many times, due to the portable nature of the game sets, cornhole is played at remote locations, such as a grass lot outside a restaurant, an individual's yard, a parking lot, or the like. Many times, if a user desires music to be played while playing cornhole, they must rely on various conventional radios or other mobile devices. Because the cornhole platforms are typically placed about 27 feet apart, it may be difficult for both teams to enjoy the music at an appropriate volume at the same time. Optionally, each cornhole team may play their own music, however, such an arrangement may make discussion between the teams, from one cornhole platform to the other, difficult.

Mobile devices are often used by individuals to play music. Such devices include, for example, smartphones, tablets, and the like. The sound playback in these mobile devices, however, are often limited. To rectify this issue, many manufacturers offer wireless speakers that connect with mobile devices to provide an improved audio playback. However, this user-provided solution poses the same drawbacks as outlined above, namely, achieving consistent sound at both spaced-apart cornhole platforms, where the users are located during game play. Moreover, such wireless speakers provide an additional accessory that must be taken along by a user when going to play cornhole.

In view of the foregoing, there is a need for a product that is capable of providing sound simultaneously at both cornhole platforms, where such a device may be easily and conveniently fixed to the cornhole platforms.

SUMMARY OF THE INVENTION

Embodiments of the present invention provide a method for generating sound from a game surface comprising receiving an audio signal into a wireless receiver of a sound system affixed adjacent an underside of a game platform supporting the game surface, the sound system including a housing having the wireless receiver; amplifying the audio signal into an amplified signal, the amplifier disposed within the housing; and delivering the amplified signal to one or more exciters mounted to an underside of the game surface.

Embodiments of the present invention further provide a method of generating sound in a cornhole game comprising receiving an audio signal from a mobile device into a wireless receiver of a sound system affixed adjacent an underside of each of two game platforms supporting a game surface of the cornhole game, the sound system including a housing having the wireless receiver; amplifying the audio signal into an amplified signal, the amplifier disposed within the housing; and delivering the amplified signal to one or more exciters mounted to an underside of the game surface.

Embodiments of the present invention also provide a cornhole game configured to playback sound comprising a first and second game platform configured to be spaced apart during game play; a first and second sound system disposed under a top surface of each of the first and second game platforms; a wireless receiver in each of the first and second sound systems for receiving an audio signal; an amplifier in each of the first and second sound systems for amplifying the audio signal into an amplified signal; and at least one exciter mounted directly onto an underside of the top surface of each of the first and second game platforms.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
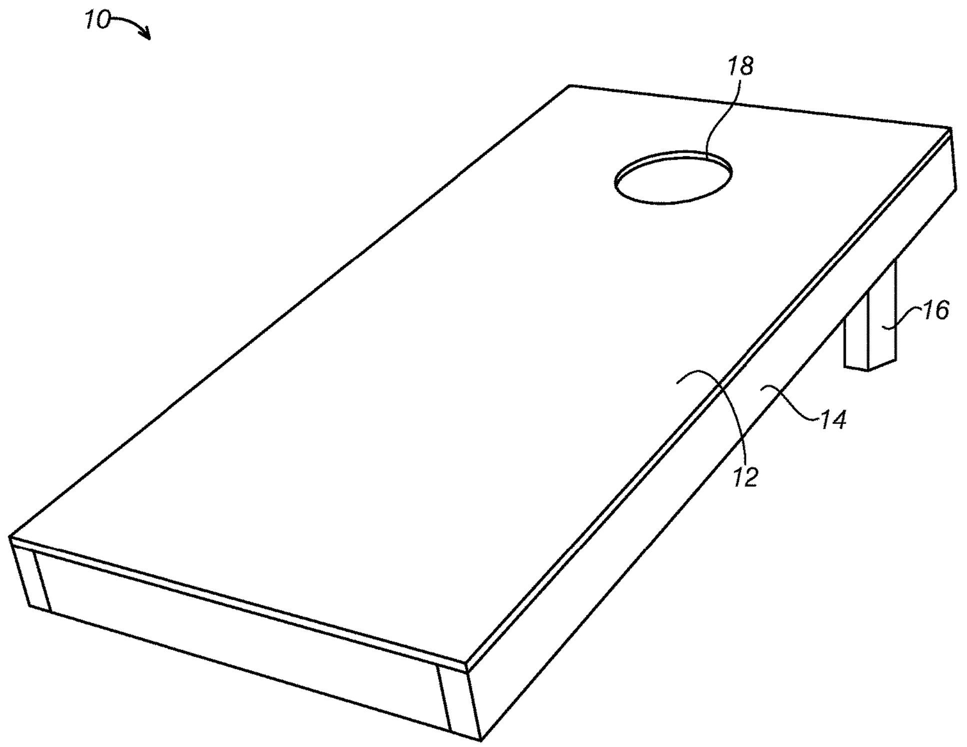
FIG. 1 illustrates a top, front perspective view of a cornhole platform having a hidden sound system according to an exemplary embodiment of the present invention.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention, and is not intended to limit the invention to the specific embodiments illustrated by the figures or description below.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary, a variety of optional components are described to illustrate the wide variety of possible embodiments of the present invention.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature (s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Figure 2:
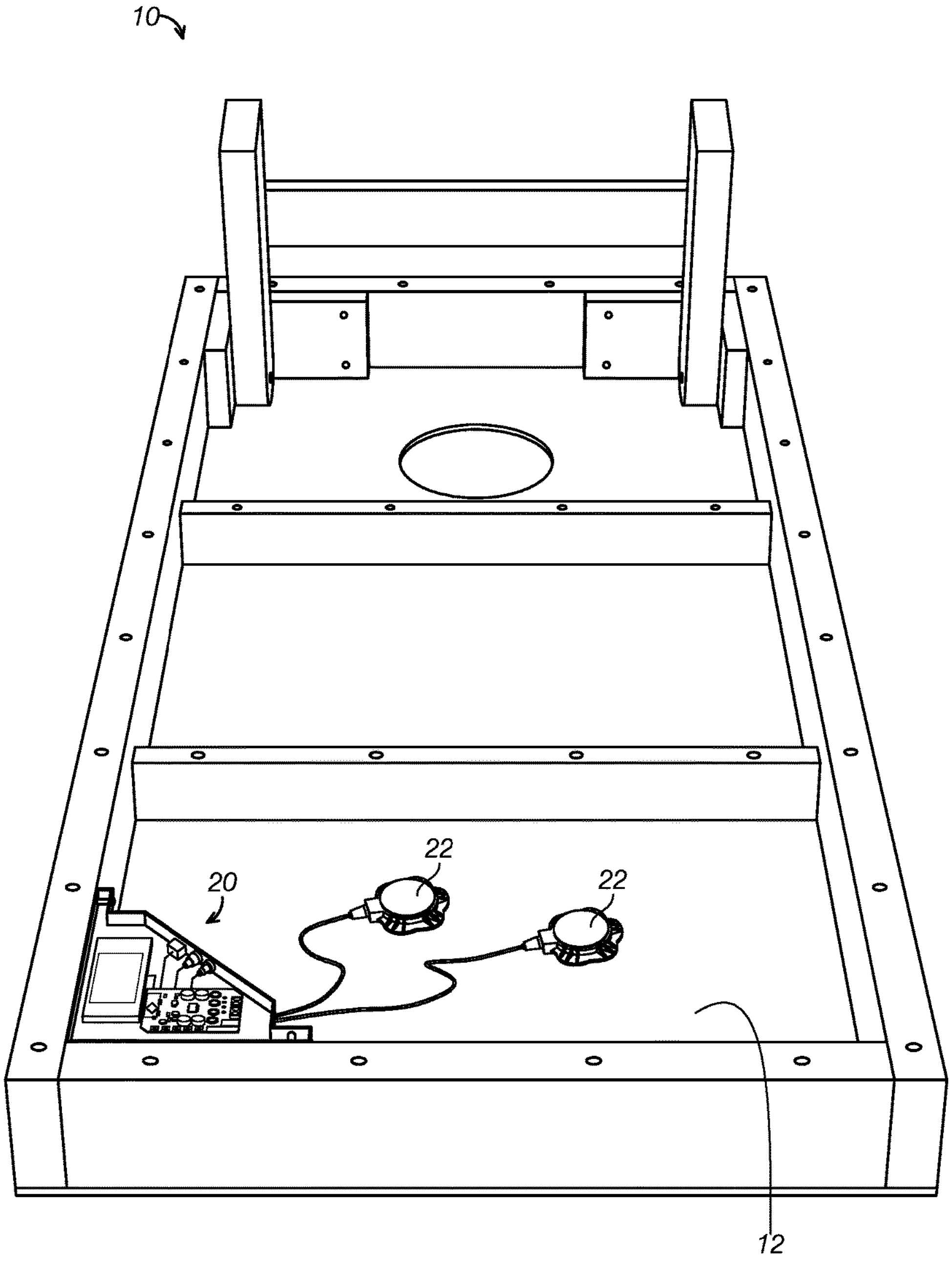
FIG. 2 illustrates a bottom, front perspective view of the cornhole platform of FIG. 1, illustrating the components of the sound system according to an exemplary embodiment of the present invention.

Referring to FIGS. 1 and 2, a cornhole platform 10, or simply, platform 10, includes a top surface 12 attached to a plurality of sidewalls 14. One or more legs 16, which may be hinged to fold adjacent to a back side of the top surface 12, may extend along one end of the platform 10 to angle the top surface 12 relative to the surface on which its placed. The cornhole platform 10 can include a hole 18 cut into the top surface 12 near the end raised by the legs 16.

Figure 3:
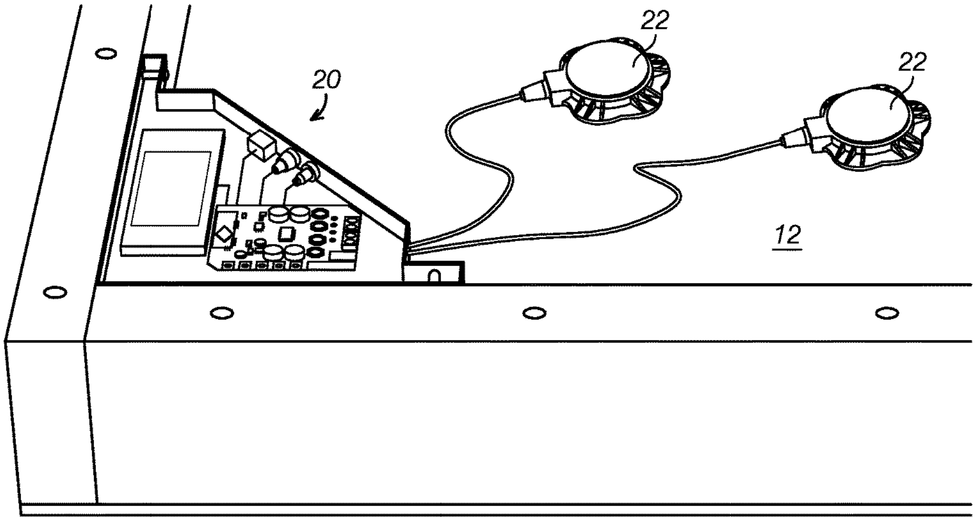
FIG. 3 illustrates a detailed bottom, front perspective view of the sound system of FIG. 2.

Referring now to FIGS. 2 and 3, a sound system 20 may be fit to the underside of the each of the two platforms 10 used in the cornhole game. Typically, the sound system 20 can mount in a corner of the sidewalls 14, as shown, but other mounting positions are contemplated within the scope of the present invention. At least one exciter 22 may be electrically connected to the sound system 20. The exciter 22 may be attached to the underside of the top surface 12 to conduct vibrating energy thereto, allowing the top surface 12 to radiate sound as though it was a speaker.

While the Figures show two exciters 22 mounted on the underside of the top surface 12, depending on application, one or more exciters 22 may be used. In some embodiments, the exciter 22 may be a water resistant exciter that has an IPX4 rating, for example. In some embodiments, the exciter 22 may be a 25 millimeter, or greater, voice coil diameter exciter. When two exciters 22 are used, as shown, typically the exciters may be 8 ohm exciters attached in parallel for a net 4 ohm load for the amplifier, described below.

Figure 4:
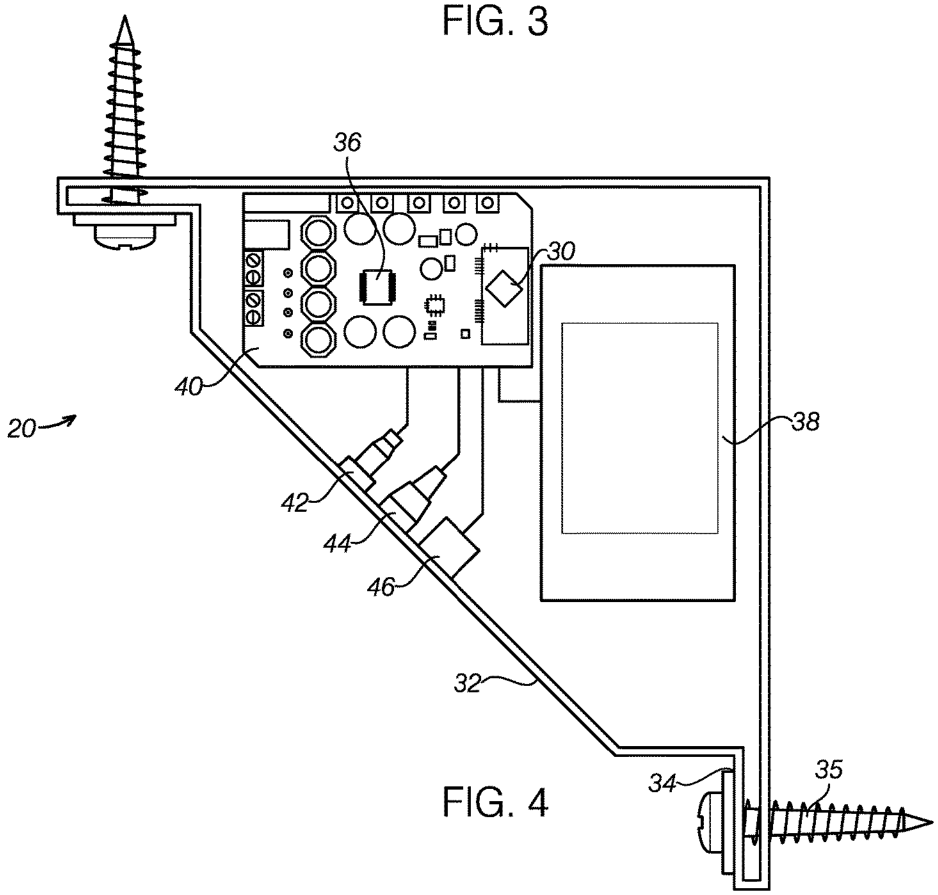
FIG. 4 illustrates a detailed top view of an electronics enclosure of the sound system of FIG. 2, with a top cover removed to show the components disposed therein.

Referring to FIG. 4, the sound system 20 can include a housing 32 (the top of the housing 32 is removed in the Figures for illustrative purposes only) that is typically a water resistant housing, such as a housing that has an IPX4 rating, for example. The housing 32 may house the electronic components for receiving an audio signal from a mobile device (not shown) and delivering that signal to drive the exciters 22, as shown in FIG. 2.

A wireless receiver 30 may be attached to a circuit board 40 within the housing. The wireless receiver 30 may include features of near field communication (NFC) for pairing a mobile device to the wireless receiver 30, and one or more wireless communication protocols. For example, the wireless receiver 30 may be a Bluetooth® 4.0+ enhanced data rate (EDR) receiver that may support, for example, advanced audio distribution profile (A2DP), audio-video remote control profile (AVRCP), hands free profile (HFP), headset profile (HSP), and TrueWirelss (TWS) technology which allows for streaming A2DP music on a master device which then relays the audio stream to a slave device, as may be the case when the sound system is incorporated into the two cornhole platforms 10 used to play a cornhole game.

The circuit board 40 can further include an amplifier 36 for amplifying the signal received from the wireless receiver 30 and sending that signal to the exciters 22. The amplifier 36 may be, for example, a one-channel 12 W-15 W amplifier, although other amplifiers may be used, depending on the particular application and user demands. The amplifier may include an audio path that includes digital signal processing (DSP) with a minimum of 5-bands tunable parametric equalizer with a +/−10 dB range. In some embodiments, the audio path can also include a robust DSP dynamic range controller (DRC) with compressor, limiter and variable clamp and release times. In some embodiments, a volume control (not shown) may be disposed, within the housing 32, for adjustment of the maximum and minimum outputs of the sound system 20.

A battery 38 may be disposed within the housing 32 to provide power to the wireless receiver 30 and the amplifier 36. The battery 38 can be any suitable design. In some embodiments, the battery 38 may be a rechargeable lithium-ion battery with a battery management system for safe charging. Typically, the battery 38 can provide 4.2V DC (nominal) with 3000 mAh. The size and voltage may be adjusted as needed for a particular application. Typically, the battery 38 may be sized to provide up to about 12 hours of use on a single charge. A charging jack 44 may be accessible from outside of the housing 32 to provide a charging power to recharge the battery as needed.

In addition to the charging jack 44, a power switch 46 may be accessible from outside the housing 32. The power switch 46 may turn power, from the battery 38, on and off to the sound system 20. The power switch 46 may be configured as any type of switch, such as a toggle switch, a slide switch, a push button switch, or the like. The charging jack 44 may include a plug, cover, or the like (not shown) to ensure water resistance when not in use.

An indicator light 42 may be visible from the exterior of the housing 32. The indicator light 42 may be a light emitting diode (LED), for example. In some embodiments, the indicator light 42 may be a plurality of lights for indicating pairing status, charging status, battery charge, or the like. In some embodiments, the indicator light 42 may be a single light, such as a multi-color LED for indicating pairing status, charging status, and the like.

The housing 32 may be shaped in a triangular shape, for example, for mounting at a corner of the underside of the platform 10. Other shapes are contemplated within the scope of the present invention, depending on the particular application. A mounting point 34 may be positioned at each leg of the housing 32, where a screw 35 may be used to affix the sound system 20 to the sidewalls 14 of the platform 10, as shown in FIG. 2.

Figure 5:
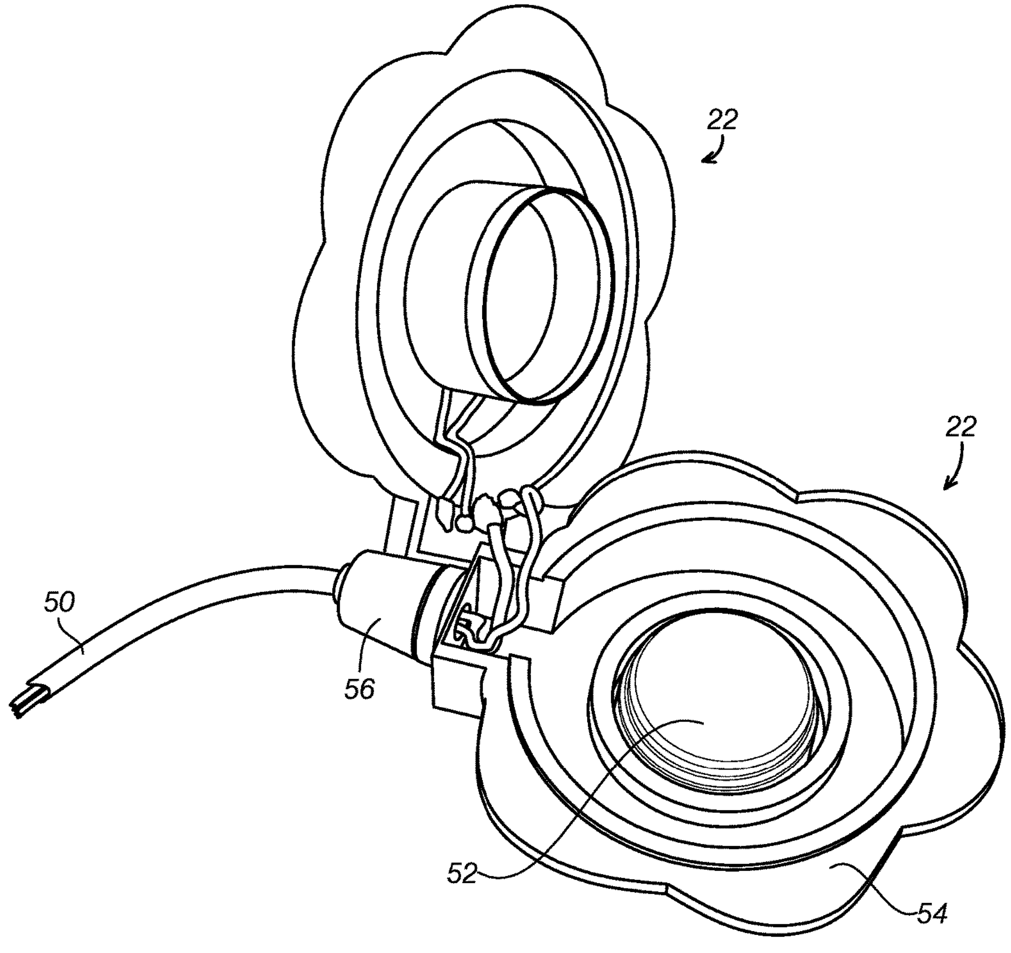
FIG. 5 illustrates a detailed perspective view of an exciter of the sound system of FIG. 2 with its case opened to illustrate internal components thereof.

Referring to FIG. 5, the exciter 22 may include a cord 50 for electrical connection to the sound system 20. Typically, the cord 50 may be from about 10 inches to about 20 inches in length, for example, but may be longer or shorter depending on application. The cord 50 may attach to the exciter 22 at connection 56, which may be a hard-wired connection to help prevent wire disconnection and ensure water resistance. A voice coil 52 may be disposed within the housing 54 of the exciter 22. The exciter may attach to the underside of the top surface 12 of the platform 10 be an automotive grade pressure sensitive adhesive or a similar adhesive, such as 3M®'s very high bond (VHB) adhesive.

As discussed above, the exciter 22 may be sized and shaped in various configurations. In some embodiments, the exciters 22 may be chosen to provide a 150 Hz to 18 kHz frequency response when mounted to a ¼ inch to ½ inch wood surface, which is typically used for the top surface 12 of the platform 10. Different exciters 22 may be provided, as needed, depending on the material of the top surface 12 or if the top surface 12 is a different thickness, for example. The top surface 12 can be made from various materials, such as plastic, medium density fiberboard (MDF), particle board, plywood, sheet metal, or the like.

As discussed above, the sound system 20 may be positioned in each of the two platforms 10 used for a cornhole game. In some embodiments, each sound system may pair with a single mobile device, each sound system may pair with different mobile devices, or one sound system may pair with a mobile device, and that system may relay the audio stream to the second sound system. The wireless receiver 30 may have a range of at least 30 feet, thereby allowing a user to carry a single mobile device to send a signal either or both sound systems 20 in each platform, regardless of whish platform the user is adjacent while playing the game.

While the above describes using the sound system 20 on a cornhole game, the sound system 20 of the present invention may be fitted for use on various games that may utilize a play surface, including those that utilize spaced-apart play surfaces.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A method for generating sound from a game surface, comprising:

receiving an audio signal into a wireless receiver of a sound system affixed adjacent an underside of a game platform supporting the game surface, the sound system including a housing having the wireless receiver;
amplifying the audio signal into an amplified signal, the amplifier disposed within the housing;
delivering the amplified signal to one or more exciters mounted to an underside of the game surface; and
conducting vibrating energy to the game platform with the one or more exciters for the game surface to radiate sound,
wherein the game surface is configured for a cornhole toss game with one or more game platforms.

2. The method of claim 1, wherein:
the game platform includes two game platforms with two game surfaces spaced apart from each other during play;
each of the two game platforms has a sound system affixed thereunder; and
each of the two game surfaces has one or more exciters mounted to the underside thereof.

3. The method of claim 2, wherein the wireless receiver includes a protocol to link sound systems affixed to each of the two game platforms.

4. The method of claim 1, wherein a rechargeable battery is disposed within the housing.

5. The method of claim 1, wherein the sound system is user-affixed to the game platform, permitting a user to upgrade a game platform without sound.

6. The method of claim 1, further comprising receiving the audio signal into the wireless receiver from a mobile device.

7. A method of generating sound in a cornhole game, comprising:
receiving an audio signal from a mobile device into a wireless receiver of a sound system affixed adjacent an underside of each of two game platforms supporting a game surface of the cornhole game, the sound system including a housing having the wireless receiver;
amplifying the audio signal into an amplified signal, the amplifier disposed within the housing;
delivering the amplified signal to one or more exciters mounted to an underside of the game surface; and
conducting vibrating energy to the game surface with the one or more exciters for the game surface to radiate sound.

8. The method of claim 7, further comprising using a communication protocol to link each of the sound systems attached to each of the two game platforms, permitting each of the game platforms to generate sound from a single source.

9. The method of claim 7, wherein the sound system is user-affixed to at least one game platform.

10. The method of claim 7, further comprising indicating a status of charging and a status of pairing via at least one indicator light disposed on an exterior of the housing.

11. A cornhole game configured to generate sound, the cornhole game comprising:
a first and second game platform configured to be spaced apart during game play;
a first and second sound system disposed under a top surface of each of the first and second game platforms;
a wireless receiver in each of the first and second sound systems for receiving an audio signal;
an amplifier in each of the first and second sound systems for amplifying the audio signal into an amplified signal; and
at least one exciter mounted directly onto an underside of the top surface of each of the first and second game platforms,
wherein the least one exciter is configured to conduct vibrating energy to the corresponding game platform for the corresponding top surface to radiate sound.

12. The cornhole game of claim 11, wherein the at least one exciter includes two exciters on each of the first and second game platforms.

13. The cornhole game of claim 11, wherein the first and second sound systems are disposed in a triangular housing configured to be user-attached to side walls of each of the first and second game platforms.

14. The cornhole game of claim 11, wherein the wireless receiver in the first sound system receives the audio signal from a mobile device, and the wireless receiver in the second sound system receives the audio signal from the first sound system via a wireless protocol.

15. The cornhole game of claim 11, wherein the first and second sound systems and the at least one exciter are each water resistant.

16. The method of claim 1, wherein the game surface comprises a substantially planar sheet of material that is vibrated by the one or more exciters.

17. The method of claim 7, wherein the game surface comprises a substantially planar sheet of material that is vibrated by the one or more exciters.

18. The cornhole game of claim 11, wherein each top surface comprises a substantially planar sheet of material that is vibrated by the corresponding at least one exciter.

19. The cornhole game of claim 11, wherein each top surface comprises at least one of plastic, medium density fiberboard (MDF), particle board, plywood, or sheet metal.

20. The cornhole game of claim 11, wherein each top surface vibrated by the corresponding at least one exciter has a larger surface area than the corresponding at least one exciter along a plane which the at least one exciter is mounted directly onto the underside of the top surface of each of the first and second game platforms.

* * * * *